(12) United States Patent
Budker et al.

(10) Patent No.: US 12,742,742 B2
(45) Date of Patent: Sep. 22, 2026

(54) RADIATION-DETECTED ZERO- TO ULTRALOW-FIELD NUCLEAR MAGNETIC RESONANCE

(71) Applicants: Johannes Gutenberg-Universität Mainz, Mainz (DE); CERN—European Organization for Nuclear Research, Meyrin (CH); GSI Helmholtzzentrum für Schwerionenforschung GmbH, Darmstadt (DE)

(72) Inventors: Dmitry Budker, Mainz (DE); James Eills, Mainz (DE); Magdalena Kowalska, Prévessin Moëns (FR); Karolina Kulesz, Meyrin (CH); John Blanchard, Mainz (DE)

(73) Assignees: Johannes Gutenberg-Universität Mainz;, Mainz (DE); CERN—European Organization for Nuclear Research, Meyrin (CH); GSI Helmholtzzentrum für Schwerionenforschung GmbH, Darmstadt (DE)

( * ) Notice: Subject to any disclaimer, the term of this patent is extended or adjusted under 35 U.S.C. 154(b) by 160 days.

(21) Appl. No.: 18/712,676

(22) PCT Filed: Nov. 26, 2021

(86) PCT No.: PCT/EP2021/083136
§ 371 (c)(1),
(2) Date: May 22, 2024

(87) PCT Pub. No.: WO2023/093993
PCT Pub. Date: Jun. 1, 2023

(65) Prior Publication Data

US 2025/0020605 A1 Jan. 16, 2025

(51) Int. Cl.
*G01N 24/08* (2006.01)
*G01R 33/28* (2006.01)
(Continued)

(52) U.S. Cl.
CPC .......... *G01N 24/08* (2013.01); *G01R 33/282* (2013.01); *G01R 33/323* (2013.01);
(Continued)

(58) Field of Classification Search
CPC .... G01N 24/08; G01R 33/282; G01R 33/323; G01R 33/445; G01R 33/302; G01R 33/42;
(Continued)

(56) References Cited

U.S. PATENT DOCUMENTS

2017/0299675 A1* 10/2017 Rigla Perez .......... G01T 1/1603
2019/0265369 A1* 8/2019 Archibald ............ G01T 1/2019
2021/0208294 A1* 7/2021 Wu ...................... A61B 6/037

FOREIGN PATENT DOCUMENTS

WO 2018053256 A1 3/2018

OTHER PUBLICATIONS

Zhu, Xiao-Hong, et al. "In vivo 17O NMR approaches for brain study at high field." NMR in Biomedicine: An International Journal Devoted to the Development and Application of Magnetic Resonance In vivo 18.2 (2005): 83-103. (Year: 2005).*
(Continued)

*Primary Examiner* — Rishi R Patel
(74) *Attorney, Agent, or Firm* — Shook, Hardy & Bacon L.L.P.

(57) ABSTRACT

The present invention relates to a method and an apparatus (100) for investigating an object (10) by using nuclear magnetic resonance, the apparatus (100) comprising: —a magnetically shielded chamber (20) for magnetically shielding the object (10) from external static magnetic fields when
(Continued)

being investigated: —a spin-manipulation unit (30), which is arranged, at least in parts, in the magnetically shielded chamber (20) and configured to manipulate spins of radioactive nuclei that are present in the object (10); and —at least one particle detector (40) which is configured to detect nuclear radiation emitted from the radioactive nuclei that are present in the object (10).

21 Claims, 4 Drawing Sheets

(51) Int. Cl.
*G01R 33/30* (2006.01)
*G01R 33/32* (2006.01)
*G01R 33/42* (2006.01)
*G01R 33/44* (2006.01)
*G01R 33/46* (2006.01)
*G01T 1/20* (2006.01)
*G01T 1/202* (2006.01)

(52) U.S. Cl.
CPC ........ *G01R 33/445* (2013.01); *G01T 1/20185* (2020.05); *G01T 1/202* (2013.01); *G01R 33/302* (2013.01); *G01R 33/42* (2013.01); *G01R 33/4608* (2013.01)

(58) Field of Classification Search
CPC .............. G01R 33/4608; G01R 33/421; G01R 33/5601; G01T 1/20185; G01T 1/202
See application file for complete search history.

(56) References Cited

OTHER PUBLICATIONS

Kumata, Katsushi, et al. "One-pot radiosynthesis of [13N] urea and [13N] carbamate using No. carrier-added [13N] NH3." Journal of Labelled Compounds and Radiopharmaceuticals: The Official Journal of the International Isotope Society 52.5 (2009): 166-172. (Year: 2009).*

International Search Report issued in corresponding International Application No. PCT/EP2021/083136, mailed Jul. 26, 2022.

Written Opinion issued in corresponding International Application No. PCT/EP2021/083136, mailed Jul. 26, 2022.

John W. Blanchard et al., "Lower than low: Perspectives on zero- to ultralow-field nuclear magnetic resonance", Journal of Magnetic Resonance, vol. 323, Feb. 2021.

Attila Jancso et al., " TDPAC and β-NMR applications in chemistry and biochemistry", Journal Of Physics G: Nuclear and Particle Physics, vol. 44, No. 6, Apr. 2017.

R.F. Kiefl et al., "Low energy spin polarized radioactive beams as a probe of thin films and interfaces", Nuclear Instruments and Methods in Physics Research Section B: Beam Interactions with Materials and Atoms, vol. 204, May 2003, pp. 682-688.

Lorenzo Bordonali et al., "Parahydrogen based NMR hyperpolarisation goes micro: an alveolus for small molecule chemosensing", Lab on a Chip, Jan. 2019, pp. 503-512.

* cited by examiner

RADIATION-DETECTED ZERO- TO ULTRALOW-FIELD NUCLEAR MAGNETIC RESONANCE

CROSS-REFERENCE TO RELATED APPLICATIONS AND PRIORITY CLAIM

This non-provisional patent application is a 371 national stage of co-pending international app. no. PCT/EP2021/083136, filed on Nov. 26, 2021, the contents of which is incorporated herein by reference in the entirety.

The present invention relates to an apparatus and a method for investigating an object by using nuclear magnetic resonance.

Nuclear magnetic resonance (NMR) spectroscopy is a powerful technique employed in many areas of modern science and industry. The conventional NMR spectroscopy is a spectroscopic technique to observe local magnetic fields around atomic nuclei. A sample or an object is placed in an externally applied strong static magnetic field (several to dozen Tesla), which provides a quantization axis around which spins precess. The NMR signal is produced by excitation of nuclear spins present in the object with an oscillating weaker magnetic field at radio-frequency (typically in the range of MHz) into nuclear magnetic resonance, which is detected with an inductive detector (inductive pickup coil).

Conventional NMR usually involves the following sequential steps:

- the orientation (polarization) of the magnetic nuclear spins in an applied strong constant magnetic field (most often provided by a superconducting magnet);
- the perturbation of this orientation of the nuclear spins (also referred to as excitation of the spins) by a weak oscillating magnetic field, usually referred to as a radio-frequency (RF) pulse or pulse sequence; and
- the detection and analysis of the magnetic fields produced by the nuclei of the sample as a result of this perturbation (inductive detection of the spin precession, also referred to as Larmor precession).

Accordingly, nuclear magnetic resonance (NMR) experiments are conventionally performed in large magnetic fields in order to increase resolution (particularly chemical shift resolution) and to maximize signal via higher nuclear spin polarization and improved inductive detection sensitivity.

However, while a seemingly indispensable element of NMR is a strong (>1 tesla) magnetic field, recent progress in physics and chemistry has enabled detection of NMR signals at ultra-low and zero magnetic fields. This zero- to ultralow-field (ZULF) NMR is an alternative magnetic resonance modality where measurements are performed in the absence of an applied static magnetic field. Due to the absence of an applied static magnetic field, ZULF-NMR is mainly based on internal spin interactions of the object to be investigated.

ZULF-NMR is an alternative nuclear magnetic resonance modality that does not rely on the presence of a strong magnetic field for polarizing the nuclei, encoding the chemical or spatial information, or detection of nuclear magnetization. While having numerous advantages (e.g., the ability to make measurements within metal reactors), and being complementary to the traditional high-field NMR, the ZULF-NMR technique is generally inferior in its sensitivity necessitating the use of relatively large, concentrated, or isotopically labelled samples. Moreover, ZULF-NMR requires state-of-the-art magnetometry for the detection, i.e. most sensitive magnetic sensors or magnetometers (such as atomic magnetometers or SQUIDs) as detectors.

Another alternative nuclear magnetic resonance modality is the so-called radiation-detected (RD) NMR (in particular beta-NMR or gamma-NMR), where the nuclear spin polarization or spin alignment is inferred via observation of spatial asymmetry in beta-decay or gamma-decay of unstable probe nuclei. Radiation-detected NMR employs particle detection techniques (particularly including beta radiation and gamma radiation detection techniques) and has demonstrated sensitivity exceeding that of traditional NMR by several orders of magnitude. However, radiation-detected NMR is usually applied to very short-lived nuclei, which were polarized during their production process or immediately afterwards (e.g. at a radioactive ion beam facility), usually before they were introduced into the sample to be studied. Moreover, radiation-detected NMR has been mostly performed in strong magnetic fields (about 0.5 to several tesla). Thus, radiation-detected NMR has been mostly limited to big installations, such as radioactive ion beam facilities or nuclear reactors with a beamline for thermal neutrons. It also shares some of the limitations of high-field NMR, where for higher resolution, higher magnetic field is used.

Thus, it is an object of the present invention to address the respective shortcomings of ZULF-NMR and RD-NMR and to provide a technique which is much more powerful than the application of the two techniques individually. This object is solved according to the invention by the features of the independent claims. Preferred embodiments of the invention are subject of the dependent claims.

According to one aspect of the present invention, an apparatus for investigating an object by using nuclear magnetic resonance is provided. The apparatus comprises:

- a magnetically shielded chamber for magnetically shielding the object from external static magnetic fields when being investigated;
- a spin-manipulation unit which is arranged, at least in parts, in the magnetically shielded chamber and configured to manipulate spins of radioactive nuclei that are present in the object (i.e., particularly radioactive nuclei of the object itself and/or radioactive nuclei introduced into the object); and
- at least one particle detector which is configured to detect nuclear radiation emitted from the radioactive nuclei that are present in the object.

The magnetically shielded chamber is an enclosure for housing the object (or sample) to be investigated. The chamber or housing is made from a material (in particular a high permeability and electrically conductive material such as "MuMetal") which shields an external magnetic field, for example, by diverting the magnetic flux and drawing the magnetic field lines into the shielding material. The "magnetically-shielded chamber" is also referred to herein as "magnetically-shielded enclosure", "magnetically-shielded housing" or simply as "magnetic shield".

In particular, the magnetically shielded chamber is configured to shield the object from external static magnetic fields (i.e. magnetic fields that are constant over time) when the object is placed within the chamber for being investigated. In other words, the magnetically shielded chamber, in which the object is placed when being investigated, provides a magnetically shielded environment or region, i.e. an environment or region which is substantially free from an external static magnetic field. Thus, like in ZULF-NMR, the object or sample is investigated in a zero- to ultralow-field region (ZULF-region), i.e. a region which is not or almost not affected by an external static magnetic field. In particular, the expressions "substantially free from an external static magnetic field" and "not or almost not affected by an external static magnetic field" relate to a static magnetic field below the earth's magnetic field and particularly below 1 μT. Thus, in other words, the magnetically shielded chamber is configured to provide an environment or region for investigating the object in a static magnetic field which is below the earth's magnetic field and particularly below 1 μT (ZULF region). In addition to the magnetically shielded chamber, compensating coils may be used to provide the ZULF-region. Such coils are also useful to make the magnetic field more homogeneous.

Thus, according to the present invention, and contrary to conventional NMR and also contrary to conventional RD-NMR (beta or gamma NMR), the object is investigated by means of nuclear magnetic resonance in a magnetically shielded configuration, preferably in the absence of an external static or constant magnetic field.

Further, contrary to conventional ZULF-NMR, where magnetic-field sensors are used for detecting an NMR signal, the apparatus according to the present invention comprises at least one particle detector (e.g. two or more particle detectors, particularly one or two pairs of particle detectors) for detecting nuclear radiation (radioactive radiation), such as beta or gamma radiation, emitted from radioactive nuclei of the object or sample to be investigated. The radioactive nuclei may already be present in the object itself or it may be created (by a nuclear reaction, such as a pickup of a thermal neutron) from stable nuclei present in the object. Alternatively or in addition, the radioactive nuclei may have been introduced (particularly implanted) into the object.

Within the present invention, a "particle detector" particularly encompasses any detector for detecting all kinds of nuclear radiation, i.e. radiation that results from a radioactive decay including beta decay and gamma decay. Accordingly, within the present invention, a "particle detector" particularly encompasses a detector for detecting beta radiation (particle radiation consisting of electrons) and/or a detector for detecting gamma radiation (particle radiation consisting of photons). Thus, in other words, a "particle detector" may be a detector for detecting beta radiation and/or a detector for detecting gamma radiation.

The at least one particle detector may comprise or be at least one beta-particle detector or at least one gamma radiation detector. The at least one particle detector may comprise different parts, for example a scintillator and a photomultiplier. One or more of these parts may be arranged in the magnetically shielded chamber, while one or more other parts of the at least one particle detector may be arranged outside of the magnetically shielded chamber. Accordingly, in other words, the at least one particle detector may be arranged, at least in parts, in the magnetically shielded chamber. However, when using gamma radiation and thus gamma detection, the gamma detector (and thus all of the detector parts) may be arranged outside of the magnetically shielded chamber. This is because for high-energy gamma radiation, it is in principle possible to pass through several layers of Mu-metal shielding. In case of using nuclei that emit beta-particles, the nuclei may be prepared by orienting the nuclei. In case of using nuclei that emit gamma radiation, the nuclei may be prepared by aligning the nuclear spins. It is noted in this respect that "orientation" of the nuclei means that their spins preferentially point in the direction of the orientation. In the case of "alignment", there is not necessarily a preferred direction but rather a preferred axis. For example, if the nuclear spins preferentially point up or down rather then left or right, this is alignment.

The apparatus may further comprise an object holder (or sample holder) for positioning and holding the object at a measuring position within the magnetically shielded chamber. The object holder for positioning and holding the object at a measuring position (i.e. a position of the object when being investigated) within the magnetically shielded chamber may comprise a tube (made, for example, from glass and/or titanium) in which the object or sample can be placed and held. The object holder may be movable in order to bring the object into and out of the magnetically shielded chamber, i.e., to bring the object to the measuring position and out of it. Alternatively, the object holder may be a holder which is fixed at the measuring position. In this case, the object has to be placed into the object holder by other means. Preferably, the measuring position is in the center of the magnetically shielded chamber.

The spin-manipulation unit is particularly configured for manipulating the spins of radioactive nuclei that are present in the object. Radioactive nuclei that are present in the object may comprise radioactive nuclei of the object itself and/or radioactive nuclei introduced into the object. The spin-manipulation unit may comprise one or more magnetic coils, particularly a system of magnetic coils. The spin-manipulation unit may further comprise additional electronic components for controlling the magnetic coils. For example, the spin-manipulation unit may be arranged and/or configured to apply radiofrequency pulses affecting the object when placed at the measuring position within the magnetically shielded chamber. The spin-manipulation unit is arranged, at least in parts, within the magnetically shielded chamber, preferably close to and/or surrounding the measuring position, and thus close to and/or surrounding the object holder and/or the object when placed in the measuring position. Preferably, the system of magnetic coils is arranged inside the magnetically shielded chamber, while other components of the spin-manipulation unit (e.g. electronic components for controlling the magnetic coils) are arranged outside the magnetically shielded chamber.

In particular, the present invention relates to zero- to ultralow-field nuclear magnetic resonance detected via radioactive decay. Accordingly, the apparatus according to the present invention may be referred to as a radiation-detected zero- to ultralow-field nuclear magnetic resonance (RD-ZULF-NMR) apparatus.

While ZULF-NMR has conventionally only been detected via inductive (as in traditional NMR) and non-inductive (atomic magnetometers, SQUIDs) magnetic sensors, and beta/gamma NMR has conventionally only been performed on unstable nuclei polarized outside the object to be investigated, right after being produced, and at an externally applied static magnetic field (usually in the range of one to several tesla), the present invention provides a new technique enhancing and amplifying the advantages of conventional ZULF-NMR and conventional RD-NMR, while largely eliminating the shortcomings of both. The result is an NMR method (referred to herein as RD-ZULF-NMR) with ultrahigh sensitivity and chemical specificity, immune to sample inhomogeneity and presence of conductors. Moreover, the overall setup can be made compact, inexpensive, and portable. Thus, the present invention addresses the respective shortcomings of ZULF and beta/gamma NMR, resulting in a synergistic hybrid technique being much more powerful than the application of the two techniques (ZULF-NMR and RD-NMR) individually. In particular, the present invention leads to a dramatically expanded range of applicability, potential portability, relatively low cost, and heretofore inaccessible functionality. For example, the present invention enables industrial process monitoring and point-of-care diagnostic capabilities. Possible applications of the present invention range from materials science to medical diagnostics and nuclear chemistry.

In a further preferred embodiment, the apparatus further comprises a computer-based data acquisition system which is coupled to the at least one particle detector and configured to record the signal from the at least one particle detector. Preferably, the data acquisition system is also coupled with the spin-manipulation unit and configured to control the spin-manipulation unit (and thus the experimental sequence of the NMR measurements carried out). Further preferable, the data acquisition system is configured to determine and/or calculate the asymmetry of the beta or gamma decay. In particular, the data acquisition system may be configured to obtain spectroscopic data on the object based on the change in the anisotropy of decay radiation under the influence of the object's material or the application of radiofrequency pulses.

In a further preferred embodiment, the apparatus further comprises radioactive nuclei introduction means (or a radioactive nuclei introduction unit) for introducing radioactive nuclei into the object to be investigated. Means for introducing or implanting radioactive (unstable) nuclei into an object may be configured to directly introducing or implanting the radioactive nuclei as a beam of atoms or ions (low energy or high energy), or to introduce the radioactive nuclei as part of a molecule in a gas or liquid, for example via small pipes or pipetting into a suitable liquid host/solvent, or by directly using a solution of the radio-labelled compound.

The apparatus may further comprise radioactive nuclei production means (or a radioactive nuclei production unit) for producing radioactive nuclei. Means for producing radioactive nuclei, for example a research nuclear reactor or a radioactive ion beam facility (ISOL-type such as ISOLDE-CERN or ISAC-TRIUMF; or in-flight such as GSI and FAIR, or RIKEN) or a medical cyclotron are well known and not further described here.

Within the present invention, it has been found that particularly the isotopes listed in the following table can advantageously be used as radioactive nuclei for RD-ZULF-NMR:

| Isotope | Spin | $t_{1/2}$ | Branching ratio (%) | $Q_{max}$(ec/β+) | β decay asymmetry factor (%) |
|---|---|---|---|---|---|
| $^{11}C$ | $\frac{3}{2}$ | 20 min | β+: 99.8<br>ec: 0.2 | 1.98 MeV | 60 |
| $^{13}N$ | $\frac{1}{2}$ | 10 min | β+: 99.8<br>ec: 0.2 | 2.22 MeV | 70 |
| $^{15}O$ | $\frac{1}{2}$ | 2 min | β+: 99.9<br>ec: 0.1 | 2.76 MeV | 70 |
| $^{32}P$ | 1 | 14.3 days | β−: 100.0 | 1.709 MeV | 100 |
| $^{129m}Xe$ | $\frac{11}{2}$ | 8.9 days | IT: 100 | 196.5 keV | — |

In the above table, $t_{1/2}$ denotes the half-life of the isotopes and $Q_{max}$ denotes the maximal energy of the emitted particles Further, β+ stands for positron, β− for electron, ec for electron capture, and IT for isomeric transition (photon emission).

In a further preferred embodiment, the radioactive nuclei that are introduced or implanted into the object to be investigated comprise at least one of the isotopes $^{11}C$, $^{15}O$, $^{13}N$, $^{32}P$ and $^{129m}Xe$. Accordingly, the apparatus may comprise a source of $^{11}C$, $^{15}O$, $^{13}N$, $^{32}P$ and/or $^{129m}Xe$ isotopes, and particularly a source of $^{11}C$-, $^{15}O$-, $^{13}N$-, $^{32}P$- and/or $^{129m}Xe$-labelled compounds. Preferably, the radioactive nuclei that are introduced or implanted into the object to be investigated comprise at least one of the isotopes $^{11}C$, $^{15}O$ and $^{13}N$. Accordingly, the apparatus may comprise a source of $^{11}C$, $^{15}O$ and/or $^{13}N$ isotopes, and particularly a source of $^{11}C$-, $^{15}O$- and/or $^{13}N$-labelled compounds. Specifically, it has been found out within the present invention that the use of $^{11}C$, $^{15}O$ and $^{13}N$, all spin ≥½ beta-emitting nuclei, allows favorable combinations of physical and chemical properties for use in RD-ZULF-NMR. The nuclei $^{11}C$, $^{15}O$ and $^{13}N$ can be hyperpolarized while being a part of a compound. Further, the activity of the radioactive sample required for RD-ZULF-NMR studies (below $10^6$-$10^7$ specified for each isotope) is lower than the licensing limit for handling a radioactive source. In order words, such sample is not subjected to obtaining licenses for a radioactive source and can be handled in a designated area of any laboratory, including those which are not classified as special radioprotection areas. The mentioned isotopes would require only licenses for waste/storage management (like any other radioactive sample), but they would not entail changes in the infrastructure. Moreover, the techniques for the production of the isotopes $^{11}C$, $^{15}O$ and $^{13}N$ are well established.

For example, $^{15}O$ has spin ½ and the relatively high maximal energy of the emitted beta particles (2.76 MeV) means that the beta-particles can penetrate several milliliters of common materials, which greatly facilitates their detection. Oxygen is also interesting biologically, like nitrogen. It is noted in this respect that the only stable oxygen isotope suitable for NMR has an abundance of 0.038%, which makes it extremely difficult to detect in NMR. It also has spin >½, which leads to shorter relaxation time, also making it more challenging for NMR.

The $^{13}N$ nuclide has spin ½, like the stable isotope $^{15}N$, and many biologically-relevant small molecules contain nitrogen atoms, including all amino acids, nucleosides and nucleotides. Of particular interest is the antibiotic drug metronidazole, which can be polarized via SABRE (signal amplification by reversible exchange) to nitrogen polarization in excess of 20%. Other examples of SABRE-polarized nitrogen-containing heterocycles include imidazole (2% $^{15}N$ polarization), nicotinamide (7% $^{15}N$ polarization) and alectinib (1.5% $^{15}N$ polarization), with many more molecules polarized to a lesser extent. The $^{15}N$ relaxation times are on the order of many minutes at low field (<1 T, and in many cases including ZULF), and due to the same spin ½ the same values are expected for 13N, which opens the possibility to track the molecules over long timescales.

The $^{11}C$ nuclide has a spin of 3/2 and is most relevant for medicine. It is one of the most ideal positron emitters for radioactive labeling of bioactive molecules in positron-emission tomography (PET) studies of various diseases: oncological, neurological and cardiovascular. Many biologically relevant molecules can be synthesized containing $^{11}C$, including acetate (C-11), choline (C-11), methionine (C-11). Importantly, these molecules have the same chemical and biological properties as the molecules containing non-radioactive 12C atoms. Thus, they are useful, for example, for metabolism tracking or drug pharmacokinetics. $^{11}C$ has a relatively long half-life of 20 min, relatively high emitted positron energy of 1.98 MeV, so these beta particles can come through even a few mm of solid material. The beta decay asymmetry factor is about 60%. Finally, $^{11}C$ can be hyperpolarized using parahydrogen-induced polarization methods.

In a further preferred embodiment, the radioactive nuclei introduction means (and particularly the hyperpolarization means described below) are configured to provide and/or produce $^{13}N$-labelled compounds based on $[^{13}N]NO_x$ and/or $[^{13}N]NH_3$. In particular, $[^{13}N]NO_x$ and/or $[^{13}N]NH_3$, which may be obtained from $H_2O$/EtOH, serves as a starting point and/or a precursor for the production of $^{13}N$-labelled compounds. In particular, the $^{13}N$-labelled compounds $[^{13}N]NO_x$ and/or $[^{13}N]NH_3$ may be hyperpolarized via SABRE, which involves bringing the molecules into contact with parahydrogen using a suitable chemical catalyst to facilitate a reversible chemical exchange. By applying suitable magnetic fields (stationary or oscillatory) to the chemical system, it is possible to generate hyperpolarization of the $^{13}N$ nuclei. The molecular precursors $[^{13}N]NO_x$ and/or $[^{13}N]NH_3$ enable a subsequent rapid synthesis of product molecules. After formation and purification, the synthesized $^{13}N$ molecules can be subjected to a hyperpolarization process.

Alternatively or in addition, the radioactive nuclei introduction means (and/or the hyperpolarization means described below) are configured to provide and/or produce $^{15}O$-labelled compounds based on $[^{15}O]O_2$. In particular, $[^{15}O]O_2$, which may be produced in a cyclotron, serves as a starting point and/or a precursor for the production of $^{15}O$-labelled compounds. Accordingly, the nuclei introduction means (and/or the hyperpolarization means described below) may comprise a cyclotron for providing and/or producing $[^{15}O]O_2$. The molecular precursor $[^{15}O]O_2$ enables a subsequent rapid synthesis of product molecules. After formation and purification, the synthesized $^{15}O$ molecules can be subjected to a hyperpolarization process.

In a further preferred embodiment, the apparatus further comprises hyperpolarization means (or a hyperpolarization unit) for hyperpolarizing radioactive nuclei present in the object (particularly radioactive nuclei of the object itself or radioactive nuclei that have been introduced into the object and/or radioactive nuclei that have been created in the object). The hyperpolarization means may comprise the radioactive nuclei introduction means. In other words, the radioactive nuclei introduction means may be part of the hyperpolarization means. Accordingly, the hyperpolarization means may have any (particularly all) of the features of the radioactive nuclei introduction means. In particular, the hyperpolarization means may be configured to produce $^{13}N$-labelled compounds, wherein the starting point of the production is preferably the precursor $[^{13}N]NO_x$ and/or the precursor $[^{13}N]NHs$ which is preferably obtained from $H_2O$/EtOH.

Moreover, the hyperpolarization means may be configured to produce $^{15}O$-labelled compounds, wherein the starting point is preferably the precursor $[^{15}O]O_2$ which is produced in a cyclotron, wherein the cyclotron may be part of the hyperpolarization means.

In general, several hyperpolarization techniques that have been developed for NMR, may also be used in connection with the present invention, these techniques including (among others):

Pre-polarization in a strong field followed by sample shuttling;

Spin-exchange optical pumping;

Metastability-exchange optical pumping;

Dynamic nuclear polarization (DNP), of which there exist a variety of implementations;

Light-assisted chemically-induced DNP (CI-DNP);

Parahydrogen-induced polarization (PHIP), including a number of different implementations.

Accordingly, various embodiments of the invention may include hyperpolarization via parahydrogen induced polarization, dynamic nuclear polarization, photochemically induced nuclear polarization, semiconductor or spin-exchange optical pumping, and/or pre-polarization in a high-field magnet (e.g. a Halbach array).

Thus, hyperpolarization may be achieved by a variety of means, including but not limited to, by placing the sample or object to be polarized in a strong external magnet (magnetic field) with subsequent shuttling of the sample into the ZULF-NMR apparatus, dynamic nuclear polarization (DNP) involving a specialized DNP apparatus, chemically induced DNP (CI DNP) that requires a light source and, possibly, magnetic-field cycling, as well as hydrogenative and non-hydrogenative parahydrogen induced polarization (PHIP) that requires a source of hydrogen gas in the para-form. Accordingly, the hyperpolarization means may comprise one or more of the following: a hyperpolarization magnet or a magnetic field generation unit, a dynamic nuclear polarization (DNP) unit, a light source, and/or a source of parahydrogen gas.

As in all NMR experiments, also RD-ZULF-NMR requires nuclei in spin-polarized states, wherein the higher the degree of the initial spin order is, the more sensitive and efficient is the method. Moreover, with respect to RD-ZULF-NMR, it is a purpose to provide hyperpolarization techniques particularly for long-lived radioactive nuclei (with half-lives of minutes or longer) to be used in RD-ZULF-NMR. Accordingly, within the present invention, such new hyperpolarization techniques are provided as described in the following.

In a preferred embodiment, the hyperpolarization means are configured to hyperpolarize $^{15}O$ by using signal amplification by reversible exchange (SABRE). SABRE is a well-known technique to generate strong non-thermal nuclear spin polarization (spin hyperpolarization) and to enhance the NMR signal intensities of a sample or substrate. SABRE turns typically weak magnetic resonance responses into strong signals making previously impractical measurements possible. More specifically, SABRE is a variant of a para-hydrogen induced polarization (PHIP). Generally, in SABRE, a suitable transition metal catalyst dissolved in an organic solvent is used, which forms a complex with $H_2$ and a substrate. In a "reversible exchange stage", non-polarized $H_2$ is replaced by polarized para-$H_2$ (p-$H_2$, the $H_2$ molecule in its singlet nuclear spin state), which transfers its polarization to the liganded substrate. Hyperpolarizing by using SABRE particularly involves bringing distinct molecules (for example $^{15}O$-labelled compounds such as $^{15}O$-labelled pyruvate, $^{13}N$-labelled compounds and/or $^{11}C$-labelled compounds) into contact with parahydrogen using a suitable chemical catalyst to facilitate the reversible chemical exchange. Particularly by applying suitable magnetic fields (stationary or oscillatory) to the chemical system, it is possible to generate a hyperpolarization. A general description of SABRE can be found, e.g., in Simon B. Duckett and Ryan E. Mewis: "Application of Parahydrogen Induced Polarization Techniques in NMR Spectroscopy and Imaging", Acc. Chem. Res. 2012, 45, 8, pages 1247-1257 (the entire content of which is incorporated herein by reference). However, although SABRE is a well-known technique, polarizing oxygen atoms using SABRE has not been used to date. The polarization process itself, as proposed herein according to an example, involves bringing a suitable molecule (for example [1-$^{15}$O]pyruvate or $[^{15}O_6]$glucose) into contact with parahydrogen gas in the presence of an iridium catalyst in solution, particularly in ultralow magnetic fields. An example of the SABRE reaction being used to polarize a $^{15}O$ nucleus in pyruvate is as follows:

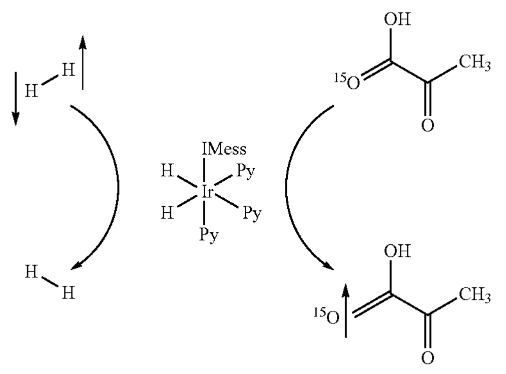

"IMes" denotes an organic compound that is a common ligand in organometallic chemistry. In particular, it is an N-heterocyclic carbene (NHC). The SABRE process may be carried out in a solution comprising or containing parahydrogen, $^{15}O$-labelled pyruvate, and a catalyst (preferably an iridium-based catalyst, but it is noted that SABRE also works with other catalysts). The $^{15}O$-labelled pyruvate and parahydrogen are in reversible exchange, temporarily binding to the catalyst as ligands before disassociating. While bound to the catalyst, polarization can flow from the parahydrogen nuclear spins to nuclear spins in the $^{15}O$-labelled pyruvate, and this causes the $^{15}O$-labelled pyruvate to become hyperpolarized.

Thus, in a further preferred embodiment, [1-$^{15}O$]pyruvate and/or [$^{15}O_6$]glucose is brought into contact with parahydrogen gas in the presence of an iridium catalyst in solution.

Accordingly, the apparatus and particularly the hyperpolarization means may comprise a source of $^{15}O$-labelled compounds (such as $^{15}O$-labelled pyruvate), a source of parahydrogen gas, and/or a source of a catalyst (particularly of an iridium catalyst). For example, the parahydrogen gas may be prepared and stored in a container (particularly a pressurized tank). Accordingly, the apparatus and particularly the hyperpolarization means may comprise a parahydrogen container for preparing, storing and/or providing parahydrogen gas. Moreover, the apparatus and particularly the hyperpolarization means may comprise a catalyst container for storing and/or providing the catalyst.

In a further preferred embodiment, $^{13}N$ nuclides are hyperpolarized by using SABRE, wherein the hyperpolarization is preferably done by using metronidazole, imidazole, nicotinamide and/or alectinib. Similar to the description with respect to the hyperpolarization of $^{15}O$ nuclides, the SABRE process for hyperpolarizing $^{13}N$ nuclides may be carried out in a solution containing parahydrogen, $^{13}N$-labelled compounds, and a catalyst (for example an iridium-based catalyst). The $^{13}N$-labelled compound and parahydrogen are in reversible exchange, temporarily binding to the catalyst as ligands before disassociating. While bound to the catalyst, polarization can flow from the parahydrogen nuclear spins to nuclear spins in the $^{13}N$-labelled compound, and this causes the $^{13}N$-labelled compound to become hyperpolarized.

Accordingly, the apparatus and particularly the hyperpolarization means may comprise a source of $^{13}N$-labelled compounds, a source of parahydrogen gas, and/or a source of a catalyst. In particular, the apparatus and particularly the hyperpolarization means may comprise a parahydrogen container for preparing, storing and/or providing parahydrogen gas. Moreover, the apparatus and particularly the hyperpolarization means may comprise a catalyst container for storing and/or providing the catalyst.

In a further preferred embodiment, $^{11}C$ is hyperpolarized by using parahydrogen-induced polarization methods. In particular, SABRE may be used for hyperpolarizing $^{11}C$. Similar to the description with respect to the hyperpolarization of $^{15}O$ and $^{13}N$ nuclides, the SABRE process for hyperpolarizing $^{11}C$ nuclides may be carried out in a solution containing parahydrogen, $^{11}C$-labelled compounds, and a catalyst (for example an iridium-based catalyst). The $^{11}C$-labelled compound and parahydrogen are in reversible exchange, temporarily binding to the catalyst as ligands before disassociating. While bound to the catalyst, polarization can flow from the parahydrogen nuclear spins to nuclear spins in the $^{11}C$-labelled compound, and this causes the $^{11}C$-labelled compound to become hyperpolarized. However, particularly with respect to $^{11}C$, SABRE is not the only way to achieve hyperpolarization using parahydrogen. It is also possible to perform chemical reactions using parahydrogen that are not reversible. The parahydrogen molecules can be chemically reacted with a precursor molecule which becomes hydrogenated, and the hyperpolarization of the parahydrogen protons can lead to hyperpolarization of other nuclear spins in the product molecules. This either occurs spontaneously, or after application of suitable magnetic fields (either static or oscillatory).

Accordingly, the apparatus and particularly the hyperpolarization means may comprise a source of $^{11}C$-labelled compounds, a source of parahydrogen gas, and/or a source of a catalyst (for example an iridium-based catalyst). In particular, the apparatus and particularly the hyperpolarization means may comprise a parahydrogen container for preparing, storing and/or providing parahydrogen gas. Moreover, the apparatus and particularly the hyperpolarization means may comprise a catalyst container for storing and/or providing the catalyst.

The detection of beta and gamma particles is preferably done with magnetically non-perturbing radiation detectors within the magnetic shielding necessary for the ZULF regime. These could be, for example, LaBr3(Ce) and/or GAGG(Ce) scintillation crystals for gamma detection or plastic scintillators for beta-particle detection. The scintillation light can be guided outside of the magnetic shield with fiber optics so that photodetectors, that are generally magnetic, are outside the magnetic shield. Another option is the use of silicon photomultipliers (SiPM) that can be both nonmagnetic and insensitive to magnetic fields. They have very good time resolution, small operating voltage (below 100 V) and small size.

Thus, in a further preferred embodiment, the at least one particle detector comprises at least one plastic scintillator for the detection of beta radiation, wherein the at least one plastic scintillator is preferably used in connection with at least one silicon photomultiplier. Preferably, the at least one silicon photomultiplier (SiPM) is both nonmagnetic and insensitive to magnetic fields. Alternatively or in addition, the at least one particle detector comprises one or more LaBr3(Ce) and/or GAGG(Ce) scintillation crystals for the detection of gamma radiation.

In a further preferred embodiment, the at least one particle detector comprises at least one scintillator, particularly a plastic scintillator, wherein the apparatus further comprises fiber optics for guiding scintillation light produced by the at least one scintillator out of the magnetically shielded chamber.

In a preferred embodiment, the spin-manipulation unit is configured to apply IT pulses and/or continuous wave excitation and/or to perform adiabatic fast passage and/or adiabatic following to flip orientation of hyperpolarized nuclei. In particular, using adiabatic fast passage (AFP) or adiabatic following to flip orientation of hyperpolarized nuclei, a change without perturbing spins from an eigenstate may be detected. This allows for radiation-detected (RD) imaging on a timescale of the longitudinal relaxation time $T_1$ (the longitudinal relaxation times $T_1$ may be orders of magnitude longer than the transverse relaxation times). This is because the radiation-detected signal is sensitive to the bulk magnetization component in the direction of the magnetic field and/or direction of polarization, and not the transversal components that get picked up by a conventional NMR coil. This preferred embodiment may also allow the detection of the build-up of polarization during the hyperpolarization process without destroying it with audio frequency or radiofrequency pulses. Within the present invention, it has been found out that these techniques are greatly advantageous over high-flip-angle techniques that may destroy nuclear polarization. The present invention thus enables radiation-detected monitoring of relaxation processes in ZULF-NMR. It is noted that also any other excitations or excitation sequences (such as continuous radio-frequency excitation) may be applied within the present invention.

Moreover, the present invention also enables radiation-detected monitoring of hyperpolarization in ZULF-NMR. For example, in RD-ZULF-NMR according to the present invention, one can look at decay radiation in a time-resolved manner at time scales comparable to the spin precession frequency, to see the precession of asymmetric emission, even in the absence of radiofrequency pulses. This was not possible before, because the precession is much faster at tesla-level fields of conventional NMR devices, compared to the temporal resolution of the detectors.

Using multiple detectors gives a possibility of correlating signals in time (when they are expected). Thus, a polarization build-up can be observed in this manner during a hyperpolarization process. Further, using multiple detectors is useful for many other aspects of RD-ZULF-NMR. For example, ratios between counts in longitudinal and transversal detectors may be taken. Also, the signal-to-noise ratio can be increased, and common signal fluctuations can be avoided. This is advantageous because there may be an exponential decrease in single counts due to radioactive decay.

In a further preferred embodiment (which relates to a microfluidic implementation of RD-ZULF-NMR), the apparatus comprises a microfluidic channel (also referred to herein as microfluidic device or chip) which is arranged, at least in parts, in the magnetically shielded chamber. Preferably, the microfluidic channel is completely arranged in the magnetically shielded chamber and thus within a ZULF region. The at least one particle detector may be arranged, at least in parts, on a surface of the microfluidic channel. Alternatively, the at least one particle detector may form, at least in parts, the microfluidic channel (or a structure of the microfluidic channel). In particular, the microfluidic channel is configured for receiving a fluid. In particular, the object to be investigated is a fluid, which may be arranged within or injected into the microfluidic channel. The fluid may be a radioactive fluid. The fluid may further be a hyperpolarized fluid. In particular, the fluid may be hyperpolarized in-situ when being injected into the microfluidic channel. The at least one particle detector may be arranged, at least in parts, on a surface of the microfluidic channel. In particular, at least one scintillator (being part of the at least one detector) may be arranged on a surface of the microfluidic channel. Alternatively, the at least one particle detector may form, at least in parts, the structure of the microfluidic channel. In particular, at least one scintillator (being part of the at least one particle detector) may form the structure of the microfluidic channel. The at least one particle detector may further comprise at least one photomultiplier for detecting scintillation light emitted from the at least one scintillator. Preferably, the at least one photomultiplier is arranged outside of the magnetically shielded chamber and coupled to the at least one scintillator by means of optical fibers. Accordingly, processes may be observed in microfluidic devices (chips). In particular, the apparatus comprises a microfluidic device in a ZULF region, with one or more scintillators for detection either at the surface of the chip, or with one or more scintillators forming the chip structure itself. Hyperpolarized fluids may be injected into the chip and observed. This implementation allows to image with spatial resolution.

For the microfluidic implementation, hyperpolarization using paramagnetic color centers (including but not limited to nitrogen-vacancy centers in diamond) may be used. For this purpose, the apparatus and particularly the hyperpolarization means may comprise a light source and/or a pulse generation unit for generating and delivering microwave and/or radiofrequency pulses. In particular, the hyperpolarization means comprises a specialized hyperpolarization apparatus that may include a light source and a unit (or system) to produce and deliver microwave and/or radiofrequency pulses.

A further aspect of the present invention relates to a method for investigating an object by using nuclear magnetic resonance, the method comprising:

- magnetically shielding the object from external static magnetic fields by placing the object into a magnetically shielded chamber;
- exciting spins of radioactive nuclei that are present in the object by applying an excitation signal (for example one or more magnetic field pulses) by using a spin-manipulation unit which is arranged, at least in parts, in the magnetically shielded chamber; and
- detecting nuclear radiation from the radioactive nuclei that are present in the object by using at least one particle detector.

In particular, by magnetically shielding the object to be investigated, the measurements on the object are carried out in the ZULF region, i.e., in a region in the absence of applied static magnetic fields and/or in a region with static magnetic fields below 1 $\mu T$. The detection of nuclear radiation from the radioactive nuclei is preferably done while carrying out nuclear magnetic resonance measurements. The detection of nuclear radiation from the radioactive nuclei can be done by means of at least one particle detector. In particular, by detecting nuclear radiation from the radioactive nuclei, magnetic resonance data of the object are obtained based on a change in the anisotropy of the detected nuclear radiation. The magnetic resonance data may comprise spectroscopic data being obtained as a result of the nuclear magnetic resonance measurements, i.e., as a result of performing NMR measurement sequences. The change in the anisotropy of the detected nuclear radiation may be, for example, due to the influence of the object's material and/or due to the application of radiofrequency pulses.

In a preferred embodiment, the method comprises before exciting spins of radioactive nuclei that are present in the object, also the step of introducing (particularly implanting) radioactive nuclei into the object to be investigated.

In a further preferred embodiment, the radioactive nuclei comprise at least one of $^{11}C$, $^{15}O$ and $^{13}N$, which are hyperpolarized before the step of exciting spins of the radioactive nuclei. Preferably, the hyperpolarization is carried out by using SABRE and/or parahydrogen-induced polarization methods.

In a further preferred embodiment, the hyperpolarization of the radioactive nuclei (preferably long-lived nuclei) is carried out in-situ inside the magnetically shielded chamber and/or in-situ inside the object. Thus, contrary to conventional radiation-detected NMR, the (long-lived) radioactive nuclei may be hyperpolarized after being introduced into the object or after being created in the object. In particular, an in-situ ambient-temperature (and/or chemically-based) polarization of unstable nuclei may be carried out.

In a further preferred embodiment, the nuclei are hyperpolarized, delivered to the object, and NMR measurements are conducted, all on timescales comparable with the half-lives of the nuclides.

In a further preferred embodiment, at least one scintillator (particularly at least one scintillation crystal) is used for detecting nuclear radiation from the radioactive nuclei, wherein scintillation light produced by the at least one scintillator is guided out of a magnetically shielded chamber, in which the object is placed during its investigation, by using fiber optics. In particular, at least one detector with a scintillation crystal is used for detecting nuclear radiation from the radioactive nuclei. And scintillation light produced by the at least one scintillator crystal is guided out of a magnetically shielded chamber, in which the object is placed during its investigation, by using fiber optics.

In a further preferred embodiment, the object to be investigated is a radioactive fluid that is injected into a microfluidic channel, wherein the microfluidic channel is arranged, at least in parts, in the magnetically shielded chamber. The fluid may be a radioactive and/or hyperpolarized fluid. In particular, the fluid is injected into the microfluidic channel before and/or during the detection of nuclear radiation from the radioactive nuclei present in the fluid. Accordingly, investigating an object may comprise observing processes in the microfluidic channel.

In particular, a method for examining an object may comprise one or more of the following steps:

- providing (producing) an ensemble of radioactive nuclei (preferably long-lived nuclei);
- providing an experimental setup for ZULF-NMR;
- providing detectors for beta or gamma radiation, which are compatible with a ZULF environment;
- introducing the radioactive nuclei into the object to be examined/investigated (using NMR) placed inside the ZULF-NMR setup;
- polarizing the radioactive nuclei in-situ, inside the object and the ZULF-NMR setup (preferably by using atomic- and chemical-approaches applied also to stable isotopes), so that they exhibit anisotropy in the beta or gamma decay radiation (particularly in the directional distribution of the beta or gamma decay radiation);
- obtaining spectroscopic data on the object based on the change in the anisotropy of decay radiation under the influence of the object's material or application of radiofrequency pulses.

For the above mentioned further independent aspect and in particular for preferred embodiments in this regard, the explanations given above or below concerning the embodiments of the first aspect also hold true. In particular, for one independent aspect of the present invention and for preferred embodiments in this regard, the explanations given above and below concerning the embodiments of the respective other aspects also hold true.

Individual embodiments for solving the problem are described by way of example below with reference to the figures. In this case, the individual embodiments described have in part features which are not absolutely necessary for implementing the claimed subject matter, but which provide desired properties in specific applications. In this regard embodiments which do not have all the features of the embodiments described below are also intended to be regarded as disclosed in a manner coming under the technical teaching described. Furthermore, in order to avoid unnecessary repetitions, specific features are mentioned only with regard to individual embodiments from among the embodiments described below. It is pointed out that the individual embodiments are therefore intended to be considered not only by themselves but also in a joint consideration. On the basis of this joint consideration the person skilled in the art will recognize that individual embodiments can also be modified by inclusion of individual or a plurality of features of other embodiments. It is pointed out that a systematic combination of the individual embodiments with individual or a plurality of features described with regard to other embodiments may be desirable and expedient and is therefore intended to be taken into account and also to be regarded as encompassed by the description.

BRIEF DESCRIPTION OF THE FIGURES

The above and other objects, features and advantages of the present invention will become more apparent upon reading of the following description of preferred embodiments and accompanying drawings. Other features and advantages of the subject-matter described herein will be apparent from the description and the drawings and from the claims. It should be understood that even though embodiments are separately described, single features and functionalities thereof may be combined without prejudice to additional embodiments. The present disclosure is illustrated by way of example and not limited by the accompanying figures.

Preferred embodiments of the present invention are exemplarily described regarding the following figures.

DETAILED DESCRIPTION OF THE FIGURES

The following detailed description relates to exemplary embodiments of the present invention. Other embodiments of the invention are possible within the scope of the invention as defined by the appended claims. Throughout the figures, same reference signs are used for the same or similar elements.

Figure 1:
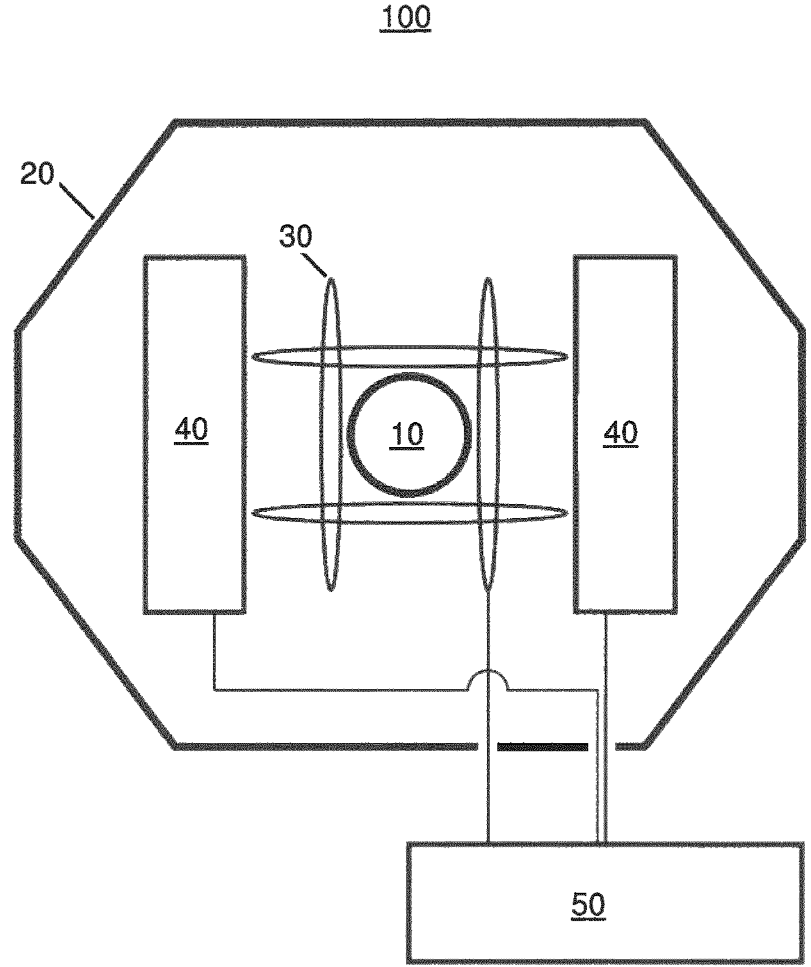
FIG. 1 shows a schematic representation of an apparatus according to a preferred embodiment of the present invention.

FIG. 1 shows a conceptional sketch of an apparatus 100 (RD-ZULF-NMR apparatus) for investigating a sample or an object 10 by using nuclear magnetic resonance according to a preferred embodiment of the present invention. A polarized sample 10 containing beta- or gamma-emitting nuclei is contained in a magnetically shielded enclosure or chamber 20 and surrounded by a system 30 of magnetic coils for spin manipulation and particle detectors 40. The signals from the detectors 40 are recorded with a computer-based data acquisition system 50 that also controls the experimental sequence. The inside of the chamber 40 is substantially free from an external static magnetic field and thus provides a ZULF region.

Thus, the apparatus 100 comprises a magnetically shielded chamber 20 for magnetically shielding the sample or object 10 from external static magnetic fields when being investigated, a spin-manipulation unit 30 for manipulating nuclear spins, and two particle detectors 40 for detecting nuclear radiation emitted from radioactive nuclei of the object 10 and/or radioactive nuclei that have been introduced into the object 10. The object 10 is placed at a measuring position within the ZULF region, i.e., in the inside of the magnetically shielded chamber 20. Preferably, the object 20 is placed substantially in the center of the chamber 20.

The computer-based data acquisition system 50 is coupled to both the spin-manipulation unit 30 and the particle detectors 40. And the data acquisition system 50 is configured to control the spin-manipulation unit 30 and record the signal from the particle detectors 40. In the embodiment shown in FIG. 1, the spin-manipulation unit 30 comprises a system of magnetic coils, which is arranged in the inside of the magnetically shielded chamber 20. However, the spin-manipulation unit 30 may further comprise other electronic components (not shown in FIG. 1) that are arranged outside the magnetically shielded chamber 20. In the embodiment shown in FIG. 1, the particle detectors 40 are arranged in the inside of the magnetically shielded chamber 20. However, the detectors 40 may comprise different parts or elements, such as a scintillator which generates scintillation light and a photomultiplier for detecting the scintillation light (not shown in FIG. 1), particularly for the conversion of the scintillation light to the amplified electrical signal. At least one of these parts, particularly one or more photomultipliers, may be arranged outside the magnetically shielded chamber 20 so that these parts do not affect the ZULF-region inside the chamber 20. The computer and the computer-based acquisition system 50 are arranged outside the magnetically shielded chamber 20, so that the ZULF region inside the chamber 20 is not influenced by these devices.

In particular, each of the particle detectors 40 may comprise a scintillator being arranged within the chamber 20. Further, scintillation light that is produced by the scintillators may be guided out of the magnetically shielded chamber 20 by means of optical fibers (not shown in FIG. 1). Thereby, the scintillation light produced by the scintillators can be detected by photodetectors (or photomultipliers) outside the magnetically shielded chamber 20. As already mentioned, guiding the scintillation light out of the chamber 40 advantageously prevents that the photodetectors (which often are magnetic) affect the ZULF region within the chamber 40. The scintillators, the optical fibers and the photodetectors may be part of the apparatus 100.

Although not explicitly shown in FIG. 1, the apparatus 100 may also comprise a source of radioactive isotopes (such as $^{11}C$, $^{15}O$, $^{13}N$, $^{32}P$ and/or $^{129m}Xe$) or a source of corresponding compounds, a source (and/or a container) of parahydrogen gas, and/or a source (and/or a container) of a catalyst.

Figure 2:
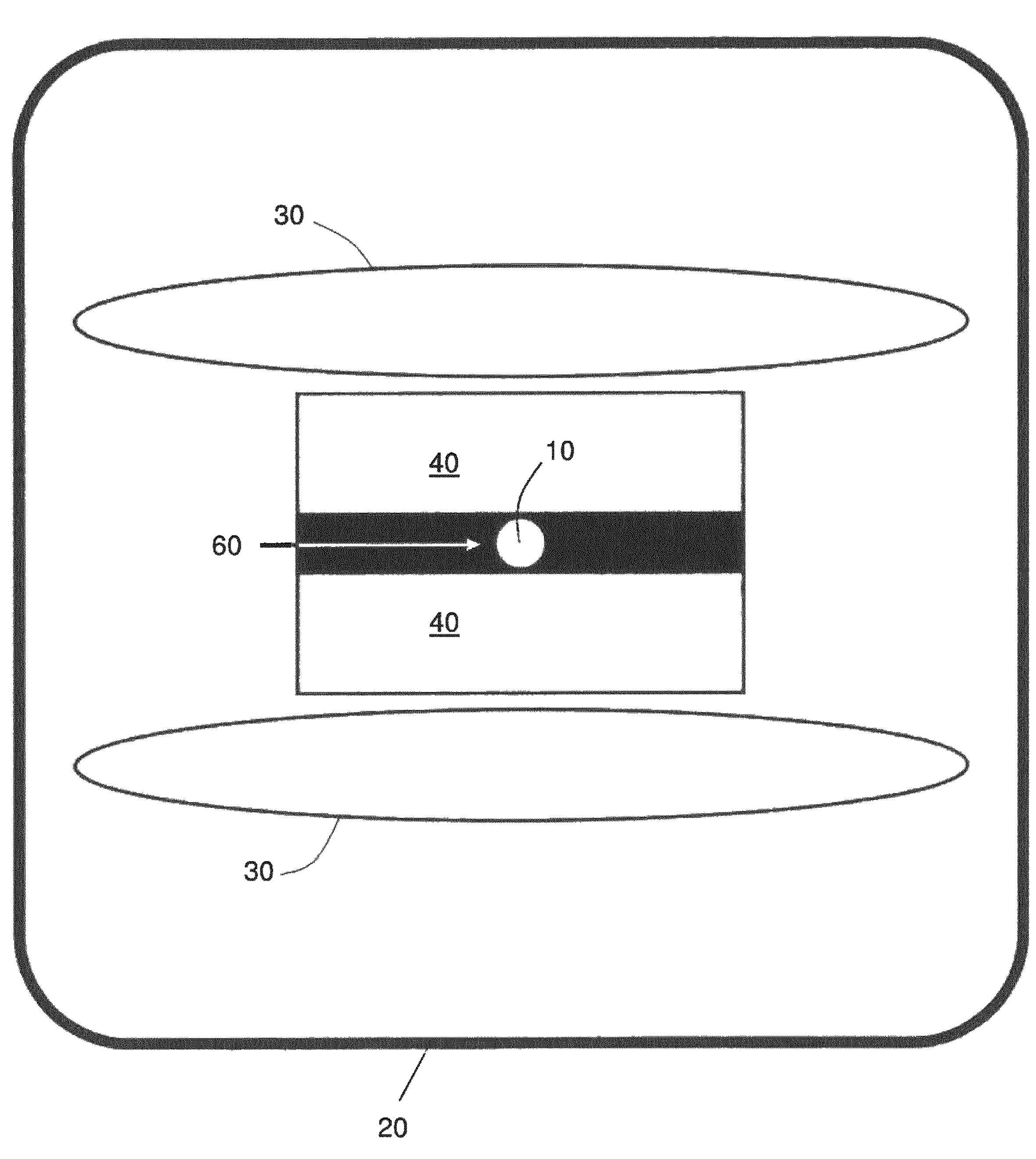
FIG. 2 shows a schematic representation of an apparatus according to another exemplary embodiment of the present invention.

FIG. 2 shows a conceptional sketch of an apparatus 100 (RD-ZULF-NMR apparatus) for investigating an object 10 by using nuclear magnetic resonance according to another exemplary embodiment (referred to herein as microfluidic implementation) of the present invention. Similar to the embodiment shown in FIG. 1, the apparatus 100 shown in FIG. 2 comprises a magnetically shielded chamber 20 for magnetically shielding the object 10 from external static magnetic fields when being investigated, a spin-manipulation unit 30 comprising excitation coils for manipulating nuclear spins present in the object 10, and two particle detectors 40 for detecting nuclear radiation emitted from radioactive nuclei of the object 10 and/or radioactive nuclei that have been introduced into the object 10.

Moreover, the apparatus 100 comprises a microfluidic channel 60 which is arranged in the magnetically shielded chamber 20 and thus within the ZULF region. As indicated in FIG. 2, the particle detectors (here scintillators) 40 may either be arranged on a surface of the microfluidic channel 60, or they may be designed to form the microfluidic channel 60 (i.e. the structure of the microfluidic channel 60). As shown in the example of FIG. 2, the object 10 to be investigated is arranged within the microfluidic channel 60. In this microfluidic implementation, the object 10 to be investigated is at least one fluid (particularly a radioactive and/or hyperpolarized fluid) that can be injected (or that is injected) into the microfluidic channel 60.

Each particle detector 40 may comprise a scintillator (comprising a scintillation crystal), and a photomultiplier for detecting scintillation light emitted from the scintillator (particularly the scintillation crystal). The at least one photomultiplier (not explicitly shown in FIG. 2) may be arranged outside of the magnetically shielded chamber 20 and coupled to the corresponding scintillator by means of optical fibers (also not shown in FIG. 2).

A hyperpolarized fluid may be injected into the microfluidic channel 60 before and/or during the detection of nuclear radiation from the radioactive nuclei of the object 10. Thereby, processes in the microfluidic channel 60 can be investigated. Although not explicitly shown in FIG. 2, the apparatus 100 of FIG. 2 may also comprise a data acquisition system 50 which may be coupled to both the spin-manipulation unit 30 and the particle detectors 40, as illustrated in FIG. 1.

Figure 3:
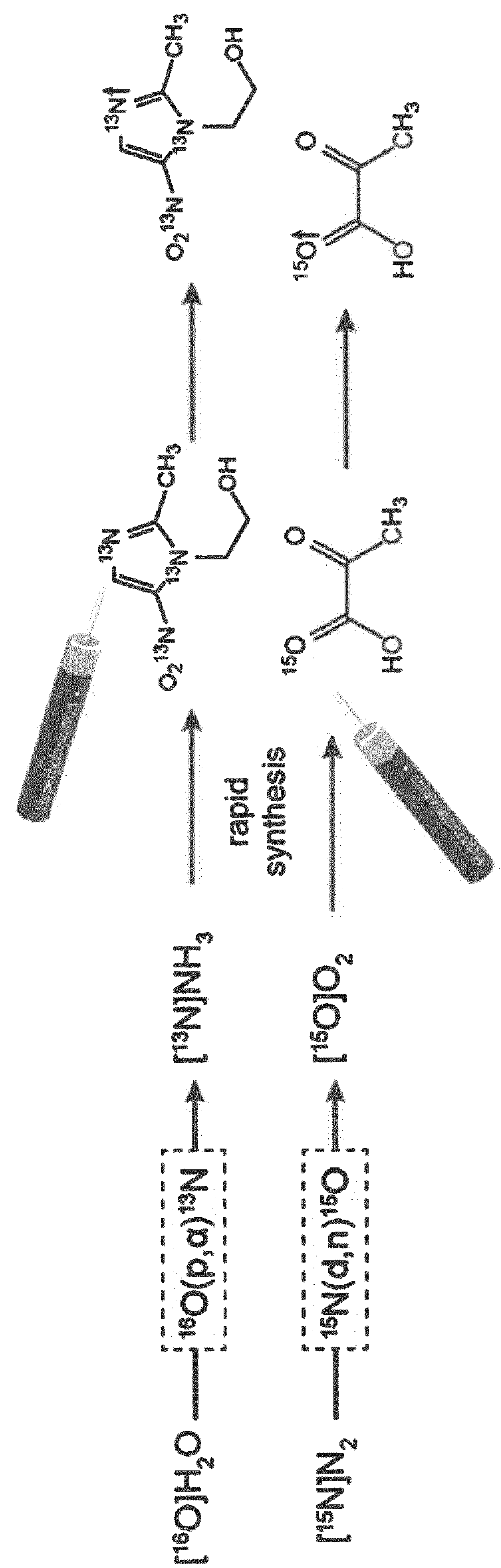
FIG. 3 shows possible procedures to produce hyperpolarized molecules for use with RD-ZULF-NMR.

Moreover, the apparatus 100 may comprise hyperpolarization means (not shown in FIGS. 1 and 2) for hyperpolarizing radioactive nuclei, particularly for hyperpolarizing radioactive nuclei of the object 10 and/or radioactive nuclei to be implanted into the object 10. In particular, the isotopes $^{13}N$ and/or $^{15}O$ may be hyperpolarized by using SABRE. Corresponding example procedures to produce hyperpolarized molecules for RD-ZULF-NMR are illustrated in FIG. 3. In the reaction schemes shown in FIG. 3, "p" denotes a proton, "a" denotes an α-particle (i.e. the He-4 nucleus), "d" denotes a deuteron (i.e. the nucleus of deuterium consisting of one proton and one neutron), and "n" denotes a neutron. As illustrated in FIG. 3 by way of example, $^{13}N$-labelled compounds and/or $^{15}O$-labelled compounds may be produced (particularly by using radioactive nuclei introduction means).

In case of $^{13}N$-labelled compounds, the starting point may be [13N]$NO_x$ and/or [$^{13}N$]$NH_3$ being used as a precursor. In particular, according to the upper scheme shown in FIG. 3, [$^{16}O$]$H_2O$ is converted into [$^{13}N$]$NH_3$ by means of a nuclear (p,α) reaction, particularly a $^{16}O(p,\alpha)$ $^{13}N$ reaction. The $^{16}O(p,\alpha)^{13}N$ reaction involves that a proton enters a $^{16}O$ nucleus and an α-particle leaves the $^{16}O$ nucleus simultaneously, thereby forming $^{13}N$.

In case of $^{15}O$-labelled compounds, the starting point may be $[^{15}O]O_2$ being used as a precursor. In particular, according to the lower scheme shown in FIG. 3, $[^{15}N]N_2$ is converted into $[^{15}O]O_2$ by means of a nuclear (d,n) reaction, particularly a $^{15}N$ $(d,n)^{15}O$ reaction. The $^{15}N$ $(d,n)^{15}O$ reaction involves that a deuteron enters a $^{15}N$ nucleus and a neutron leaves the $^{15}N$ nucleus simultaneously, thereby forming $^{15}O$. In particular, $[^{15}O]O_2$ may be produced in a cyclotron.

As illustrated in the upper scheme of FIG. 3, the molecular precursor $[^{13}N]NH_3$ enables a subsequent rapid synthesis of the following product molecule:

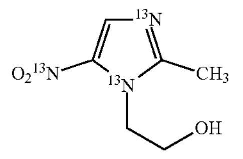

After formation and purification, the synthesized $^{13}N$ molecule can be subjected to a hyperpolarization process, thereby polarizing the $^{13}N$ nuclide (which is indicated by an arrow besides the $^{13}N$ nuclide on the rightmost molecule shown in the upper scheme of FIG. 3.

Further, as illustrated in the lower scheme of FIG. 3, The molecular precursor $[^{15}O]O_2$ enables a subsequent rapid synthesis of the following product molecule:

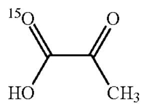

After formation and purification, the synthesized $^{15}O$ molecule can be subjected to a hyperpolarization process, thereby polarizing the $^{15}O$ nuclide (which is indicated by an arrow besides the $^{15}O$ nuclide on the rightmost molecule shown in the lower scheme of FIG. 3.

In particular, the $^{13}N$-labelled compounds and/or the $^{15}O$-labelled compounds may be hyperpolarized by using SABRE, which involves bringing the molecules into contact with parahydrogen using a suitable chemical catalyst to facilitate a reversible chemical exchange. Further, by applying suitable magnetic fields (stationary or oscillatory) to the chemical system, it is possible to generate hyperpolarization of the $^{13}N$ nuclei and/or $^{15}O$ nuclei.

Figure 4:
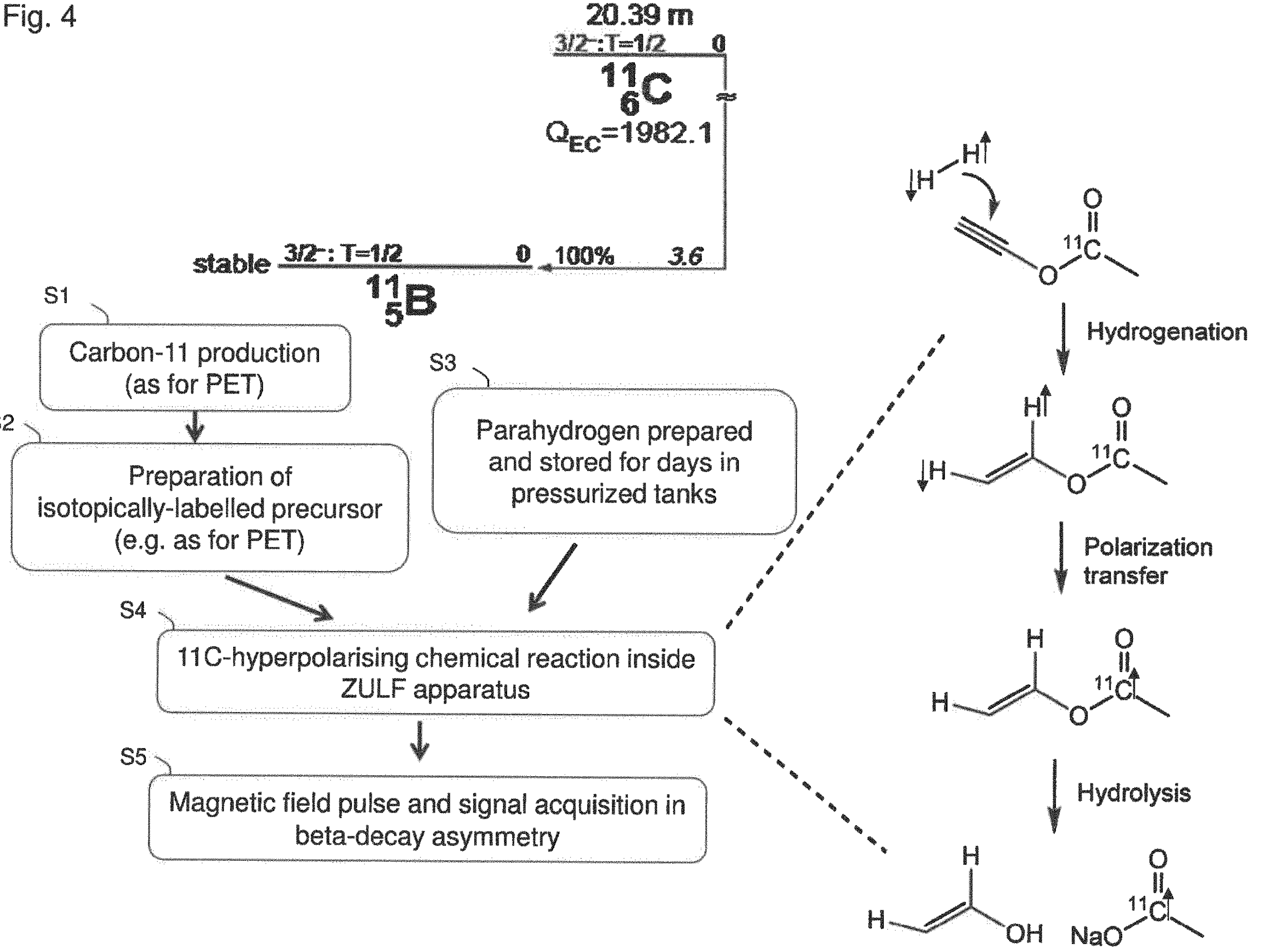
FIG. 4 shows an example of RD-ZULF-NMR measuring steps using radioactive carbon-11 ($^{11}C$) nuclei.

According to another example, $^{11}C$ (carbon-11) may be hyperpolarized by using parahydrogen-induced polarization methods. A corresponding possible procedure for hyperpolarizing $^{11}C$-labelled acetate is shown on the right-hand side of FIG. 4. As illustrated by the reaction schemes on the right-hand side of FIG. 4, the procedure includes hydrogenation, polarization transfer and hydrolysis. In the reaction schemes of FIG. 4, polarized nuclides are marked with an arrow. Further, the decay scheme of carbon-11 is depicted in FIG. 4. Moreover, an example of RD-ZULF-NMR measuring steps S1 to S5 by using radioactive carbon-11 nuclei are illustrated in FIG. 4. According to this example, $^{11}C$ isotopes are produced (step S1), particularly by radioactive nuclei introduction means and/or by hyperpolarization means. Then, based on the generated $^{11}C$ isotopes, isotopically-labelled precursors, for example $^{11}C$-labelled acetate as shown on the top right-hand side of FIG. 4, are prepared (step S2) in order to bring them together with parahydrogen. For this purpose, the parahydrogen can be prepared and stored, e.g. for days, in pressurized tanks (step 3). When bringing the isotopically-labelled precursors together with parahydrogen (step S4), the $^{11}C$ hyperpolarization chemical reaction may take place inside the magnetically shielded chamber 20 of the RD-ZULF-NMR apparatus 100. Preferably, the chemical reactions for the hyperpolarization are performed in-situ inside the magnetically shielded chamber 20 and/or in-situ inside the object 10 being arranged in the inside of the magnetically shielded chamber 20. After the hyperpolarization, NMR measurements can be carried out (step S5), i.e., one or more magnetic field signals (continuous or pulsed) can be applied and a signal acquisition in the beta-decay asymmetry can be done. Steps S1 to S3 are carried out before steps S4 and S5. The carbon-11 production (step S1) and the preparation of isotopically-labelled precursor may be carried out as for positron-emission tomography (PET). It is to be understood that the principles explained in FIG. 4 on the example of $^{11}C$ may also be applied, mutatis mutandis, in connection with other isotopes such as $^{13}N$ and $^{15}O$.

LIST OF REFERENCE NUMERALS

10 sample (object)
20 magnetic shield (magnetically shielded chamber)
30 system of magnetic coils (spin-manipulation unit)
40 detector for detecting radioactive radiation (particle detector)
50 computer (computer-based data acquisition system)
60 microfluidic device (microfluidic channel)
100 RD-ZULF-NMR apparatus
S1 producing carbon-11 (e.g. as for PET)
S2 preparing of isotopically-labelled precursor (e.g. as for PET)
S3 preparing and storing parahydrogen (for days) in pressurized tanks
S4 performing $^{11}C$-hyperpolarizing chemical reaction inside ZULF apparatus
S5 applying excitation signal and acquiring signal in beta-decay asymmetry

What is claimed is:

1. An apparatus for investigating an object using nuclear magnetic resonance, comprising:

a magnetically shielded chamber for magnetically shielding the object from external static magnetic fields when being investigated, wherein the magnetically shielded chamber, in which the object is placed when being investigated, provides a ZULF region;

a spin-manipulation unit which is arranged, at least in part, in the magnetically shielded chamber and configured to manipulate spins of radioactive nuclei that are present in the object; and at least one particle detector which is configured to detect nuclear radiation emitted from the radioactive nuclei that are present in the object.

2. The apparatus according to claim 1, further comprising:

a computer-based data acquisition system which is coupled to the at least one particle detector and configured to record the signal from the at least one particle detector.

3. The apparatus according to claim 1, further comprising: radioactive nuclei introduction means for introducing radioactive nuclei into the object to be investigated.

4. The apparatus according to claim 3, wherein the radioactive nuclei comprise at least one of $^{11}C$, $^{15}O$, $^{13}N$, $^{32}P$ and $^{129m}Xe$.

5. The apparatus according to claim 3, wherein the radioactive nuclei introduction means is/are configured to provide and/or produce $^{13}N$-labelled compounds based on $[^{13}N]$ $NO_x$ and/or $[^{13}N]NH_3$.

6. The apparatus according to claim 3, wherein the radioactive nuclei introduction means is/are configured to provide and/or produce $^{15}O$-labelled compounds based on $[^{15}O]O_2$.

7. The apparatus according to claim 1, further comprising hyperpolarization means for hyperpolarizing radioactive nuclei present in the object.

8. The apparatus according to claim 7, wherein the hyperpolarization means is/are configured to hyperpolarize $^{15}O$ by using SABRE.

9. The apparatus according to claim 7, wherein the hyperpolarization means is/are configured to bring $[1-^{15}O]$ pyruvate and/or $[^{15}O_6]$glucose into contact with parahydrogen gas in the presence of an iridium catalyst in solution.

10. The apparatus according to claim 9, wherein the hyperpolarization means is/are configured to hyperpolarize $^{13}N$ by using SABRE, wherein the hyperpolarization is done by using metronidazole, imidazole, nicotinamide and/or alectinib.

11. The apparatus according to claim 7, wherein the hyperpolarization means is/are configured to hyperpolarize 11C by using parahydrogen-induced polarization methods.

12. The apparatus according to claim 1,
wherein the at least one particle detector comprises at least one plastic scintillator for the detection of beta radiation, wherein the at least one plastic scintillator is used in connection with at least one silicon photomultiplier, and/or
wherein the at least one particle detector comprises one or more LaBr3(Ce) and/or GAGG (Ce) scintillation crystals for the detection of gamma radiation.

13. The apparatus according to claim 1, wherein the at least one particle detector comprises at least one scintillator, and wherein the apparatus further comprises fiber optics for guiding scintillation light produced by the at least one scintillator out of the magnetically shielded chamber.

14. The apparatus according to claim 1, wherein the spin-manipulation unit is configured to apply x pulses and/or continuous wave excitation and/or to perform adiabatic fast passage and/or adiabatic following to flip orientation of hyperpolarized nuclei.

15. The apparatus according to claim 1,
wherein the apparatus comprises a microfluidic channel which is arranged, at least in part, in the magnetically shielded chamber; and
wherein the at least one particle detector is arranged, at least in part, on a surface of the microfluidic channel or wherein the at least one particle detector forms, at least in part, the structure of the microfluidic channel.

16. A method for investigating an object using nuclear magnetic resonance, the method comprising:
magnetically shielding the object from external static magnetic fields by placing the object into a magnetically shielded chamber, wherein the magnetically shielded chamber provides a ZULF region;
exciting spins of radioactive nuclei that are present in the object by applying an excitation signal by using a spin-manipulation unit which is arranged, at least in part, in the magnetically shielded chamber; and
detecting nuclear radiation from the radioactive nuclei that are present in the object by using at least one particle detector.

17. The method according to claim 16, wherein before exciting spins of radioactive nuclei that are present in the object, the method comprises:
introducing radioactive nuclei into the object to be investigated.

18. The method according to claim 16, wherein the radioactive nuclei comprise at least one of $^{11}C$, $^{15}O$ and $^{13}N$, which are hyperpolarized before the step of exciting spins of the radioactive nuclei, wherein the hyperpolarization is carried out by using SABRE and/or parahydrogen-induced polarization methods.

19. The method according to claim 18, wherein the hyperpolarization of the radioactive nuclei is carried out in-situ inside the magnetically shielded chamber and/or in-situ inside the object.

20. The method according to claim 16, wherein for detecting nuclear radiation from the radioactive nuclei that are present in the object, at least one scintillator is used, wherein scintillation light produced by the at least one scintillator is guided out of the magnetically shielded chamber, by using fiber optics.

21. The method according to claim 16, wherein the object to be investigated is a fluid that is injected into a microfluidic channel, wherein the microfluidic channel is arranged, at least in part, in the magnetically shielded chamber.

* * * * *